(12) United States Patent
Lee

(10) Patent No.: US 6,621,371 B2
(45) Date of Patent: Sep. 16, 2003

(54) SYSTEM BOARD AND IMPEDANCE CONTROL METHOD THEREOF

(75) Inventor: Jung-Bae Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 56 days.

(21) Appl. No.: 09/834,512

(22) Filed: Apr. 13, 2001

(65) Prior Publication Data

US 2001/0045874 A1 Nov. 29, 2001

(30) Foreign Application Priority Data

May 4, 2000 (KR) ........................................ 2000-23917

(51) Int. Cl.[7] ................................................ H03H 7/38
(52) U.S. Cl. .............................. 333/33; 333/125; 326/30
(58) Field of Search ............................ 333/33, 34, 125, 333/127, 128, 236, 245; 326/30; 370/421; 365/198

(56) References Cited

U.S. PATENT DOCUMENTS

| | | | | |
|---|---|---|---|---|
| 4,490,697 A | * | 12/1984 | Yasuda et al. | ............... 333/156 |
| 4,947,144 A | * | 8/1990 | Le Nohaic | ................... 333/128 |
| 5,650,757 A | * | 7/1997 | Barber | ........................ 333/128 |

OTHER PUBLICATIONS

Sata, Takashi, et al. "5GByte/s Data Transfer Scheme with Bit-to-Bit Skew Control for Synchronous DRAM," 1998 Symposium on VLSI Circuits Digest of Technical Papers, 64–65.

* cited by examiner

*Primary Examiner*—Robert Pascal
*Assistant Examiner*—Stephen E. Jones
(74) *Attorney, Agent, or Firm*—Mills & Onello LLP

(57) ABSTRACT

The present invention provides a system board and an impedance control method thereof. The board includes a plurality of modules or devices, and a control apparatus for controlling the modules or devices. Signal lines are connected from the control apparatus to the plurality of modules or devices and are arranged so that the length of the signal lines between the control apparatus and the plurality of modules or devices becomes shorter the distance from the control apparatus increases. Therefore, the present invention can reduce the signal distortion phenomenon by controlling the characteristic impedance of the signal lines between the control apparatus and the plurality of modules or devices such that the characteristic impedance decreases exponentially with increasing distance from the control apparatus in the case in which modules or devices are plugged into the system board.

10 Claims, 8 Drawing Sheets

SYSTEM BOARD AND IMPEDANCE CONTROL METHOD THEREOF

BACKGROUND OF THE INVENTION

1. Field of the Invention

The present invention relates to a control apparatus and a system board comprising modules (or devices) controlled by the control apparatus, and more particularly, a system board and an impedance control method of the board for preventing the distortion of signals transmitted between modules (or devices) controlled by the control apparatus.

2. Description of the Related Art

In general, a system such as a computer comprises a control apparatus or controller and modules controlled by the controller. A typical example is a memory subsystem comprising memory modules and a memory controller. But, as data processing speed of a system increases and the amount of data to process grows, the number of modules to be plugged into a system board increases.

A system such as a computer comprises a mother board, where modules are plugged into connectors installed in the mother board. The number of modules plugged into the mother board increases according to the improvement of system performance, and an impedance of a signal line which the mother board itself has varies as modules are plugged into the mother board. This is because a unit capacitance of a transmission line varies by parasitic capacitance of the module.

In general, the distances between connectors installed in a mother board of a computer system are equal, and modules installed in these connectors are controlled by one control apparatus. Therefore, in the conventional system board, there is a great difference between a characteristic impedance of a signal line from a control apparatus to a first connector and a characteristic impedance of a signal line connected to other connectors in case those modules are plugged into the connectors. That is, the characteristic impedance of the signal line from the control apparatus to the first connector is larger than the characteristic impedance of the signal line connected to other connectors in case those modules are plugged into the connectors.

In this case, a signal distortion phenomenon can occur by a reflection due to the impedance difference in the process of signal transmission through the signal line.

A conventional system board will be described as follows with reference to the accompanying drawings. FIG. 1 is a block diagram showing a configuration of a mother board of a conventional computer system, which comprises a control apparatus 10, and n connectors CON1, CON2, CON3, . . . CONn. The n connectors CON1, CON2, CON3, . . . and CONn shown in FIG. 1 are installed in a mother board in order to plug n modules (not shown), and the control apparatus is installed in the mother board directly.

In FIG. 1, a signal line to transmit data DQ and strobe signal is arranged between the control apparatus 10 and the n connectors CON1, CON2, CON3, . . . and CONn. The length of a signal line from the control apparatus 10 to a first connector CON1 is l0, and the length of a signal line between connectors CON1, CON2, CON3, . . . and CONn is l0.

A mother board shown in FIG. 1 inputs and outputs data between the control apparatus 10 and a corresponding memory module plugged into the n connectors CON1, CON2, CON3, . . . and CONn in response to a strobe signal being output from the control apparatus 10.

Unlike the configuration shown in FIG. 1, the control apparatus 10 can be plugged into the mother board through a connector like modules, not being plugged into the mother board directly, and also, modules can be plugged into the mother board directly, not through n connectors CON1, CON2, CON3, . . . and CONn. That is, an impedance control method of a system board of the present invention to be described below is applied not only in the case of the embodiment shown in the above-mentioned FIG. 1

FIG. 2 illustrates a configuration modeling the block diagram shown in FIG. 1, which models the configuration where n modules M1, M2, M3, . . . and Mn are plugged into n connectors CON1, CON2, CON3, . . . and CONn, and k memory devices D1, . . . and Dk are loaded in each of n modules M1, M2, M3, . . . and Mn.

In FIG. 2, a serially-connected package P1 and an input driver IB1 and an output driver OB1 illustrate a control apparatus 10. A serially-connected stub resistor Rs and k memory devices D1, . . . and Dk illustrate each of modules M1, M2, M3, . . . and Mn, and serially-connected packages P21, . . . and P2$k$ and input/output drivers IB21, OB21, . . . and IB2$k$, OB2$k$ illustrate each of k memory devices D1, . . . and Dk. l0 and l0 indicate the length of signal lines on the mother board; l0 indicates the length of a signal line from a resistor Rm to a first connector CON1, and l1 indicates the length of a signal line from the first connector CON1 to a nth connector CONn.

RT1 and VT1 indicate a terminal resistor and a terminal voltage, respectively, to terminate a signal transmitted from one of modules M1, M2, M3, . . . and Mn to the control apparatus 10, and RT2 and VT2 indicate a terminal resistor and a terminal voltage, respectively, to terminate a signal transmitted from the control apparatus to the modules M1, M2, M3, . . . and Mn, respectively. That is, a signal transmitted from one of the modules M1, M2, M3, . . . and Mn to the control apparatus 10 is terminated by the terminal resistor RT1 and the terminal voltage VT1 having a specific voltage difference, the signal transmitted from the control apparatus 10 to the modules M1, M2, M3, . . . and Mn is terminated by the terminal resistor RT2 and the terminal voltage VT2 having a specific voltage difference.

The drawings of FIG. 1 and FIG. 2 are disclosed in 1998 Symposium on VLSI Circuits Digest of Technical Papers with a title of "5G Byte/s Data Transfer Scheme with Bit-to-Bit Skew Control for Synchronous DRAM".

Looking at the length of a signal line of a mother board of the conventional computer system as shown in FIG. 1 and FIG. 2, the length of signal lines between n connectors CON1, CON2, CON3, . . . and CONn are equal, except the length of a signal line from the control apparatus 10 to the first connector CON1. Then, the variation of a characteristic impedance of a signal line in case that the signal is transmitted from the control apparatus 10 to the modules M1, M2, M3, . . . and Mn is as follows, by calculating the characteristic impedance of the signal line in case that the modules M1, M2, M3, . . . and Mn are not plugged into the mother board of the computer system and the characteristic impedance of the signal line in case that the modules M1, M2, M3, . . . and Mn are plugged into the mother board as shown in FIG. 1.

The characteristic impedance Z in the case in which the modules M1, M2, M3, . . . and Mn are not plugged into the connectors CON1, CON2, CON3, . . . and CONn of the mother board of the computer system as shown in FIG. 1, can be described as the following equation (1), if an inductance per unit length of the signal line of the mother board are L and C, respectively.

$$Z = \sqrt{\frac{L}{C}} \qquad (1)$$

On the other hand, a characteristic impedance Z' of the signal line in case that the modules M1, M2, M3, . . . and Mn are plugged into the connectors CON1, CON2, CON3, . . . and CONn of the mother board can be described as the following equation (2), if a parasitic capacitance of each of the connectors CON1, CON2, CON3, . . . and CONn is Cc and the distance between connectors is l1.

$$Z' = \sqrt{\frac{L}{C + \frac{Cc}{l1}}} \qquad (2)$$

As known from equations (1) and (2), because the modules M1, M2, M3, . . . and Mn are plugged into the connectors CON1, CON2, CON3, . . . and CONn, the magnitude of a denominator of the characteristic impedance Z' becomes larger than the magnitude of a denominator of the characteristic impedance Z of the signal line, and thus the magnitude of the characteristic impedance Z' decreases. As a result, the characteristic impedance Z of the signal line from the control apparatus 10 to the first connector CON1 decreases to the characteristic impedance Z' of the signal line after the first connector CON1.

FIG. 3 is a graph showing the variation of a characteristic impedance approximately of a signal line according to the distance of a mother board of a computer system shown in FIG. 1, wherein a characteristic impedance of a signal line to the first connector CON1 maintains Z and a characteristic impedance of a signal line after the first connector CON1 maintains Z'. That is, the characteristic impedance Z' of the signal line after the first connector CON1 maintains an equal value because the length of signal lines between connectors CON1, CON2, CON3, . . . and CONn are equal.

A signal distortion phenomenon occurs in the process of signal transmission through a signal line because the characteristic impedance Z of the signal line of the mother board of the computer system as shown in FIG. 3 is reduced rapidly to the characteristic impedance Z' after the first connector CON1. The signal distortion phenomenon worsens in the process of rapid variation of the characteristic impedance, that is, in the process that a signal is transmitted from the control apparatus 10 to the first connector CON1.

SUMMARY OF THE INVENTION

It is an object of the present invention to provide a system board that can prevent the signal distortion phenomenon by reducing the variation of characteristic impedance of signal lines between modules generated plugged into the system board.

It is another object of the present invention to provide an impedance control method of a system board in order to accomplish the above object.

According to one aspect of the present invention, there is provided a system board which comprises a plurality of modules and a controller for controlling the plurality of modules. Signal lines are connected from said controller to said plurality of modules and are arranged so that the length of the signal lines between the controller and the plurality of modules becomes shorter as a distance between each of said modules and the controller increases.

In one embodiment, the characteristic impedance of signal lines between the controller and the modules decreases exponentially as the distance between each of said modules and the controller increases. Each of said plurality of modules can be a module comprising a plurality of memory devices. Each of said modules can be a memory device. In one embodiment, a dummy capacitor is included in signal lines between said controller and said plurality of modules.

According to another aspect of the present invention there is provided a system board which comprises a plurality of modules and a controller for controlling the plurality of modules. Signal lines are connected from the controller to the plurality of modules, and each of the signal lines between the controller and said plurality of modules comprises a dummy capacitor such that characteristic impedance of the signal lines decreases as a distance between each of said modules and the controller increases.

In one embodiment, the characteristic impedance of the signal lines between the controller and the modules decreases exponentially as the distance between each of the modules and the controller increases.

Each of the modules can be a module comprising a plurality of memory devices. Each of said modules can be a memory device. In one embodiment, the magnitude of the dummy capacitor increases as the distance from the controller increases when the lengths of signal lines between the modules are equal.

According to another aspect of the present invention, there is provided an impedance control method for a system board. A plurality of modules are provided, and the modules are controlled. Signal lines are connected from the controller to the plurality of modules, and the characteristic impedance of signal lines between the controller and the plurality of modules decreases exponentially as the distance between each of the modules and the controller increases.

Therefore, the system board and the impedance control method of the board of the present invention can reduce the signal distortion phenomenon by configuring the signal lines such that the characteristic impedance of signal lines between the control apparatus and modules (or devices) decreases exponentially in case that modules (or devices) are plugged on the board.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
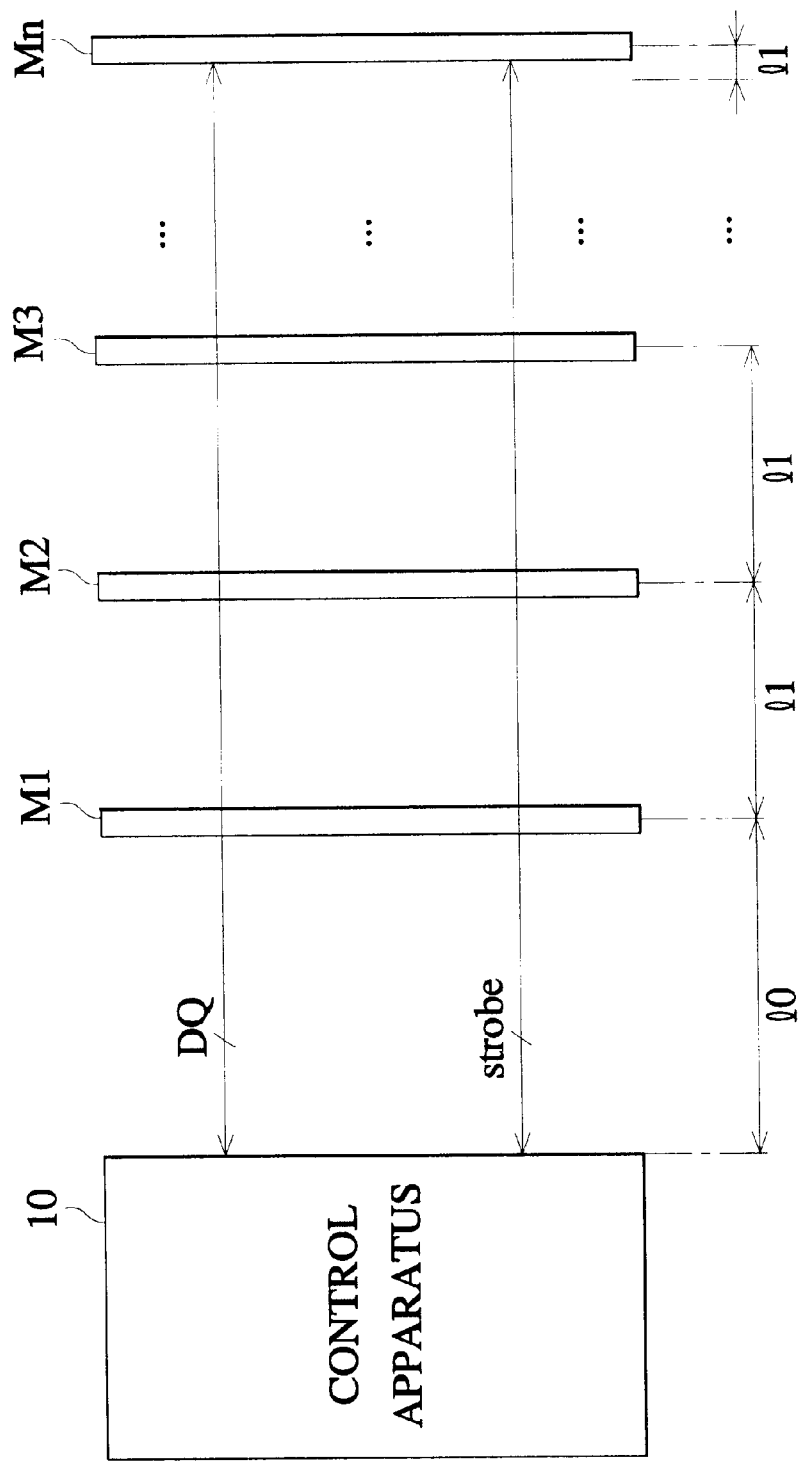
FIG. 1 is a block diagram showing a configuration of a mother board of a conventional computer system.
Figure 4:
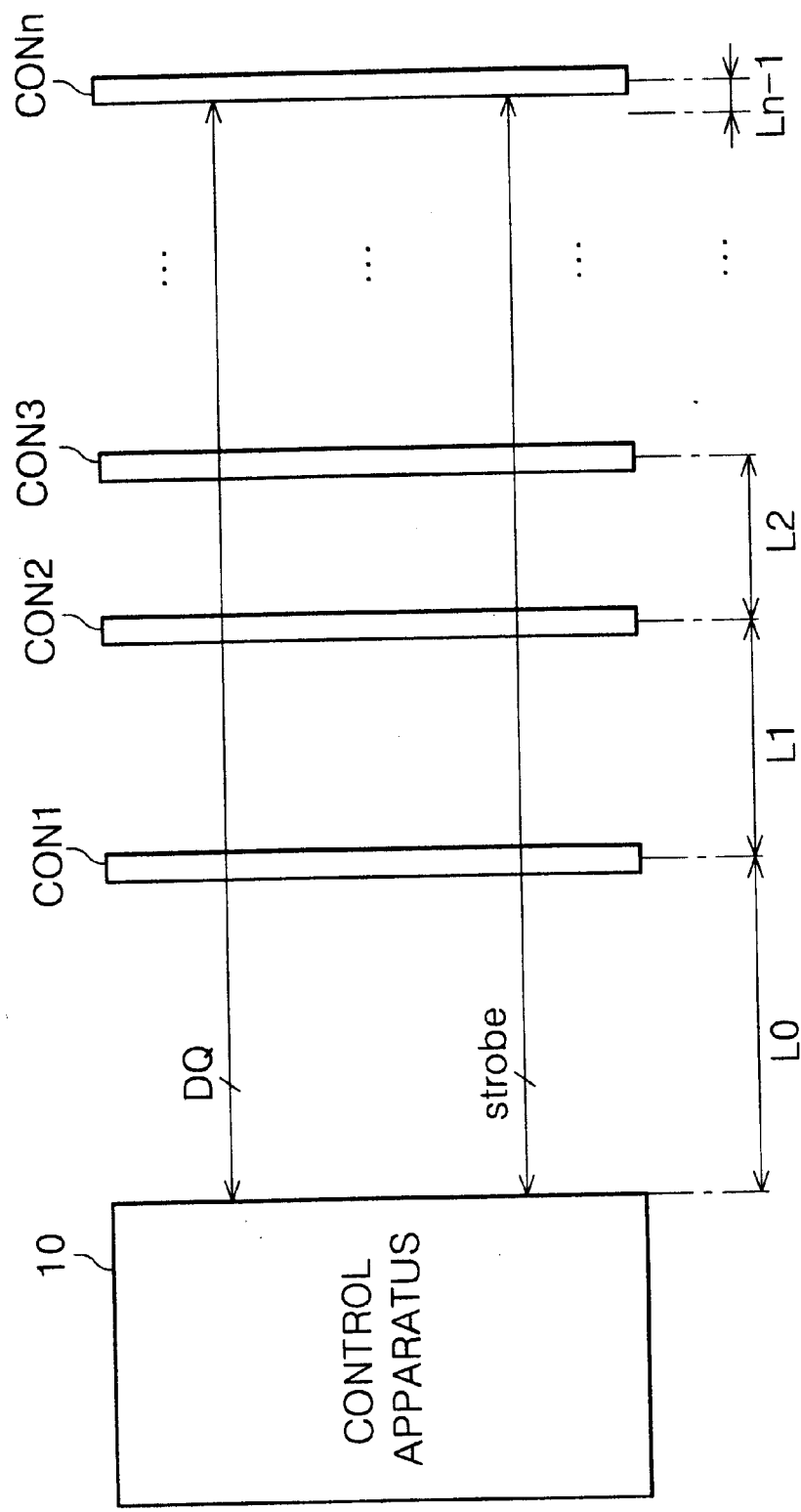
FIG. 4 is a block diagram showing a configuration of a mother board of an embodiment of the present invention.

FIG. 4 is a block diagram showing a configuration of a mother board of a computer system in accordance with an embodiment of the present invention. The difference from the configuration of the prior art shown in FIG. 1 and that of the invention shown in FIG. 4 is that the length of a signal line from a control apparatus 10 to a first connector CON1 is L0, and the length of signal lines between connectors CON1, CON2, CON3, . . . and CONn are L1, L2, . . . and L(n−1) respectively. In the configuration of the invention shown in FIG. 4, the length of signal lines between the control apparatus 10 and connectors CON1, CON2, CON3, . . . and CONn becomes shorter as the distance from the control apparatus 10 to a connector increases. That is, the mother board of the computer system of the prior art is arranged so that the length of signal lines between connectors CON1, CON2, CON3, . . . and CONn are equal, but the mother board of the computer system of the present invention is arranged so that the length of signal lines between connectors CON1, CON2, CON3, . . . and CONn becomes shorter with increasing distance from the control apparatus 10.

Figure 5:
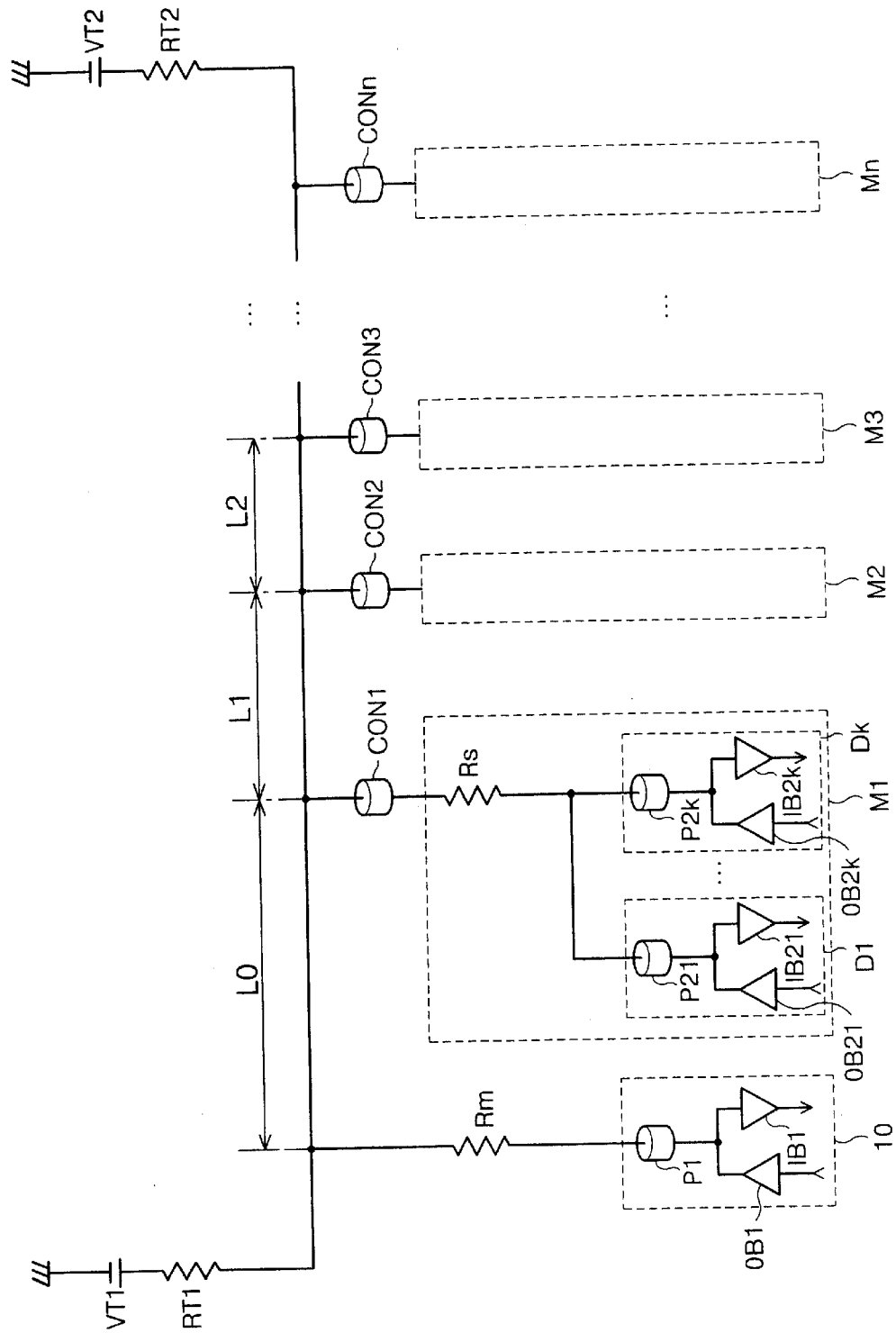
FIG. 5 illustrates a configuration modeling the block diagram shown in FIG. 4.

FIG. 5 contains a schematic diagram which illustrates a configuration modeling the block diagram shown in FIG. 4. Like the configuration shown in FIG. 4, the configuration of FIG. 5 is arranged so that the length of signal lines between connectors CON1, CON2, CON3, . . . and CONn becomes shorter with increasing distance from a control apparatus 10.

The variation of a characteristic impedance of a signal line in case that a signal is transmitted from a control apparatus 10 to modules M1, M2, M3, . . . and Mn is defined by calculating the characteristic impedance of the signal line in case that the modules M1, M2, M3, . . . and Mn are not plugged into a mother board of a computer system of the present invention and the characteristic impedance of the signal line in case that the modules M1, M2, M3, . . . and Mn are plugged into the mother board.

A characteristic impedance Z of a signal line in case that n modules M1, M2, M3, . . . and Mn are not plugged into connectors CON1, CON2, CON3, . . . and CONn of the mother board of the present invention is described according to equation (1) above. However, a characteristic impedance Z″ of a signal line in case that n modules M1, M2, M3, . . . and Mn are plugged into connectors CON1, CON2, CON3, . . . and CONn of the mother board of the present invention is described according to the following equation (3), if a parasitic capacitance of a connector is Cc and the distance between modules is L(x).

$$Z'' = \sqrt{\frac{L}{C + \frac{Cc}{L(X)}}} \quad (3)$$

As shown from equation (3), the characteristic impedance Z″ of the signal line decreases slowly after the first connector CON1 because modules M1, M2, M3, . . . and Mn are plugged into connectors CON1 CON2, CON3, . . . and CONn of the mother board of the computer system of the present invention. That is, the characteristic impedance Z″ of the signal line after the first connector CON1 decreases slowly with increasing distance from the control apparatus 10. Specifically, the distance L(x) between connectors CON1, CON2, CON3, . . . and CONn of the mother board of the present invention becomes shorter with increasing distance from the control apparatus 10. That is, the magnitude of a denominator of the characteristic impedance Z″ increases slowly by that the magnitude of the distance L(x) decreases with increasing distance from the control apparatus 10. Therefore, the characteristic impedance Z″ of a signal line after the first connector CON1 is decreased a relatively small amount as the distance from the control apparatus 10 increases.

It is desirable that a system designer adjust the distance L(x) of the signal line between connectors CON1, CON2, CON3, . . . and CONn in an optimum condition so that the characteristic impedance Z″ of the signal line after the first connector CON1 is to be decreased exponentially. This comes from a principle of acoustics, and is reflected in the form of a wind instrument such as a horn. The relationship between a sound pressure and a velocity in acoustics is similar to the relationship between a voltage and a current of the signal line on the system board, and the concept of a characteristic impedance is used in acoustics. The content relating to the above is referred to on page 37 of "Fundamentals of Acoustics" written by Kinsler et. al., incorporated herein by reference.

In most wind instruments, the area of a pipe is in inverse proportion to the characteristic impedance, and thus the area of the pipe increases gradually with increasing distance from a sound source, and has the form of increasing exponentially.

Although the above principle can not be described in a numerical formula exactly, it is disclosed that, as a result of an approximate analysis such as a horn equation of Webster, in case that the characteristic impedance varies exponentially, the form of impedance from a standpoint of a sound source is similar to the form of a high frequency filter having an improved low frequency characteristics, and this explains why a traditional wind instruments has such a form. Therefore, the present invention can remove the signal distortion phenomenon by making the characteristic impedance of a signal line of a system board decrease exponentially.

Figure 2:
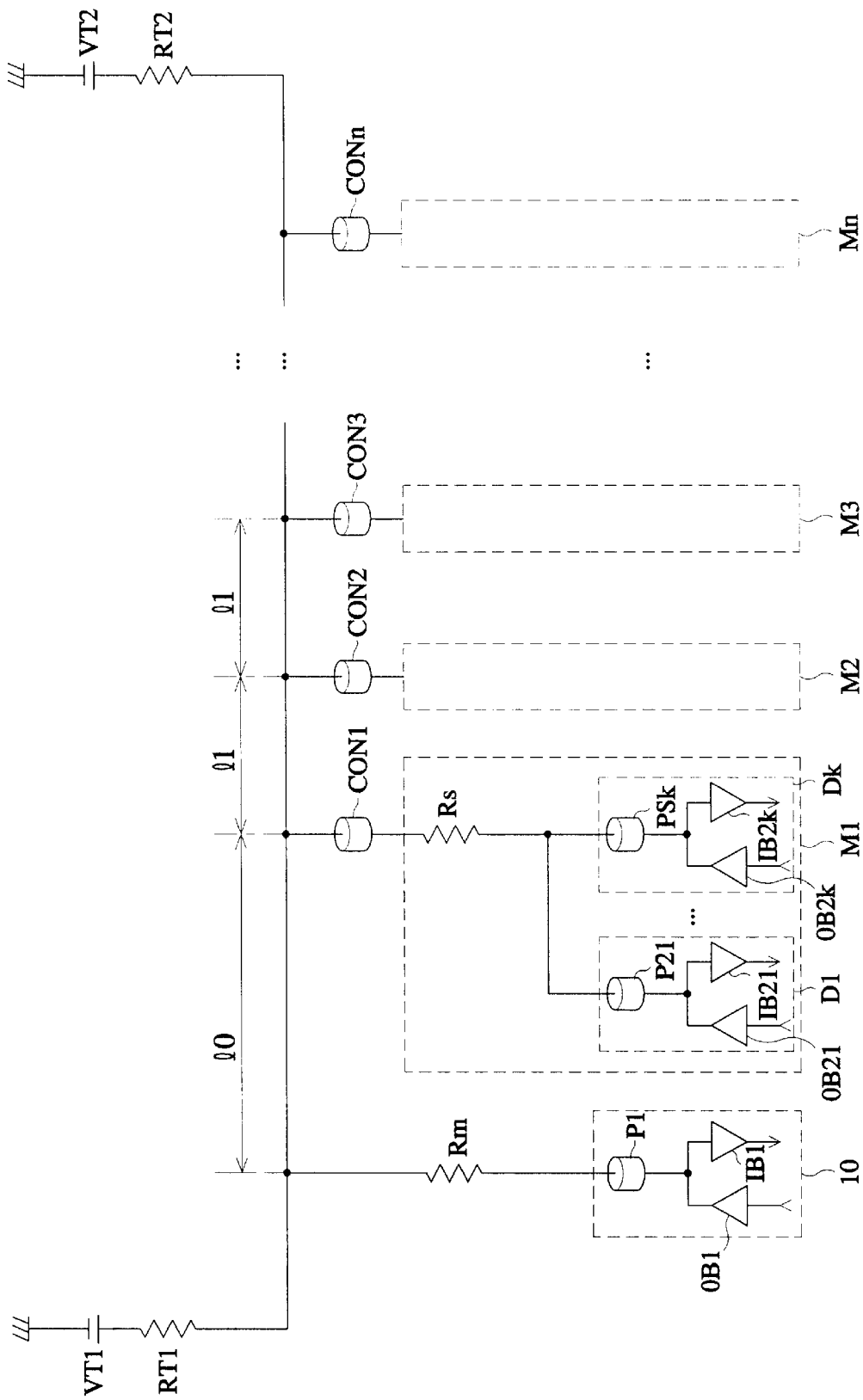
FIG. 2 illustrates a configuration modeling the block diagram shown in FIG. 1.
Figure 3:
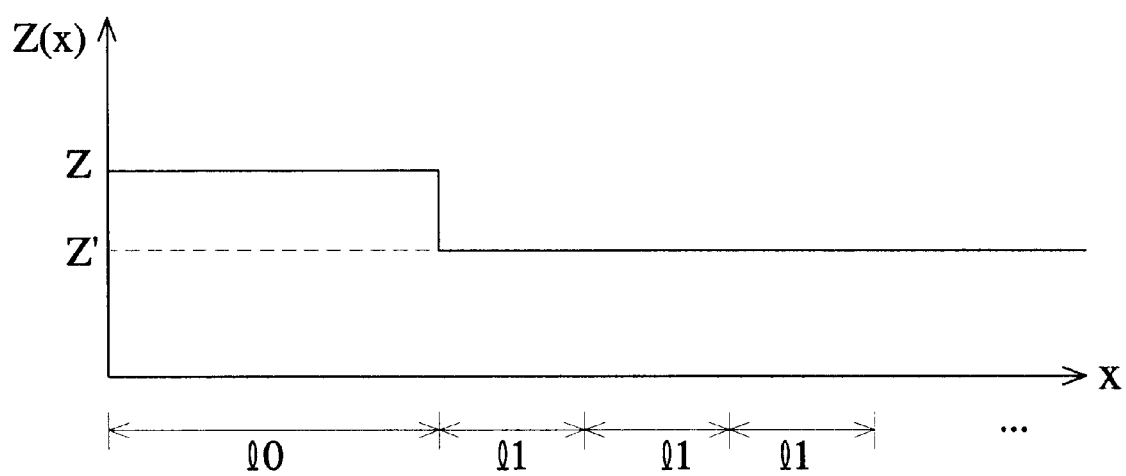
FIG. 3 is a graph showing the variation of a characteristic impedance between signal lines according to distance on the mother board shown in FIG. 1.
Figure 6:
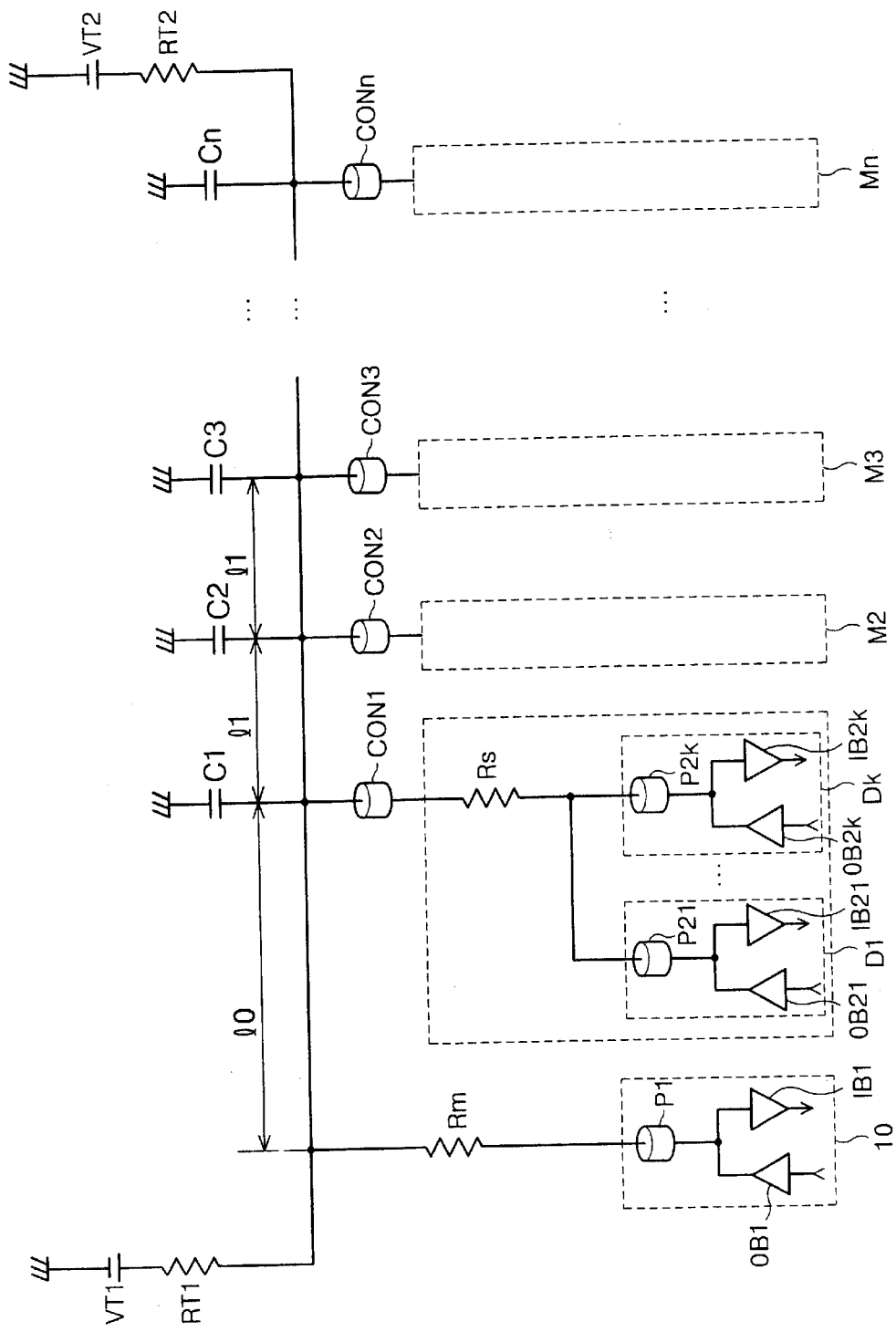
FIG. 6 is a configuration modeling the configuration of a mother board of a computer system of another embodiment of the present invention.

FIG. 6 illustrates a configuration modeling a configuration of a mother board of a computer system of another embodiment of the present invention, which is made by adding dummy capacitors C1, C2, C3, . . . and Cn to the configuration of FIG. 2. That is, the configuration of FIG. 6 illustrates a configuration in which dummy capacitors C1, C2, C3, . . . and Cn are added respectively between n connectors CON1, CON2, CON3, . . . and CONn and a ground voltage shown in FIG. 2. The configuration of FIG. 6 is such that dummy capacitors C1, C2, C3, . . . and Cn are added between the connectors CON1, CON2, CON3, . . . and CONn and the ground voltage and the values of said dummy capacitors C1, C2, C3, . . . and Cn are controlled, in order to decrease exponentially the characteristic impedance of the signal line in case that modules are plugged into connectors CON1, CON2, CON3, . . . and CONn on the mother board.

A method for controlling the value of dummy capacitors C1, C2, C3, . . . and Cn is described using equation (3) according to the following. In case that the length of signal lines L(x) between connectors CON1, CON2, CON3, . . . and CONn is equal, if increasing the magnitude of the denominator gradually, the characteristic impedance Z" of the signal line is decreased gradually. In order to increase the magnitude of the denominator gradually, it is only necessary to increase the magnitude of dummy capacitors C1, C2, C3, . . . and Cn gradually. That is, the configuration of FIG. 6 is such that the characteristic impedance Z" of the signal line after the first connector CON1 decreases exponentially by making the added dummy capacitors C1, C2, C3, . . . and Cn have large capacitances with increasing distance from the control apparatus 10. In the configuration of FIG. 6 like the configuration of FIG. 5, a system designer must control properly the value of dummy capacitors C1, C2, C3, . . . and Cn in order to decrease the characteristic impedance Z" of the signal line exponentially. Although it is shown that dummy capacitors C1, C2, C3, . . . and Cn are located on connection points of signal lines and connectors CON1, CON2, CON3, . . . and CONn in FIG. 6, dummy capacitors C1, C2, C3, . . . and Cn can be located on any position of each of signal lines between the control apparatus 10 and connectors CON1, CON2, CON3, . . . and CONn. As a result, an impedance control method of a system board of the present invention decreases the characteristic impedance of a signal line exponentially with increasing distance from the control apparatus in case those modules are plugged into connectors of the board.

Among methods realizing the above, there are a method in which the distance between connectors is narrowed gradually with increasing distance from the control apparatus as shown in FIG. 5, and a method in which the values of dummy capacitors connected between each of connectors and the ground voltage are increased with increasing distance from the control apparatus as shown in FIG. 6. These two methods, i.e., the method of the length of signal lines between connectors CON1, CON2, CON3, . . . and CONn and the method of adding dummy capacitors, can be used together.

Figure 7:
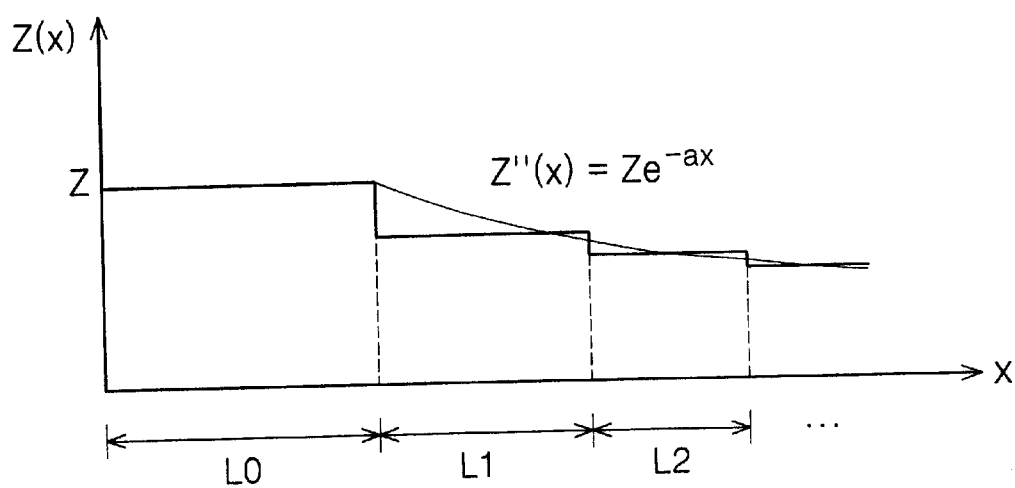
FIG. 7 is a graph showing the variation of the characteristic impedance between signal lines according to distance on a system board of the present invention.

FIG. 7 is a graph showing approximately the variation of a characteristic impedance of a signal line according to the distance of a system board of the present invention, wherein a characteristic impedance of a signal line from a control apparatus 10 to a first connector CON1 maintains Z, and a characteristic impedance of a signal line after the first connector CON1 is Z" and decreases exponentially with increasing length of the signal line. That is, an impedance Z" (x) from the first connector CON1 to an nth connector CONn can be described as $Ze^{-ax}$. Here, x is the distance between connectors CON1, CON2, CON3, . . . and CONn, and is arbitrary constant.

As stated above, the system board of the present invention reduces the signal distortion phenomenon by causing the characteristic impedance of signal lines between connectors to decrease gradually and exponentially with increasing distance from the control apparatus.

Figure 8:
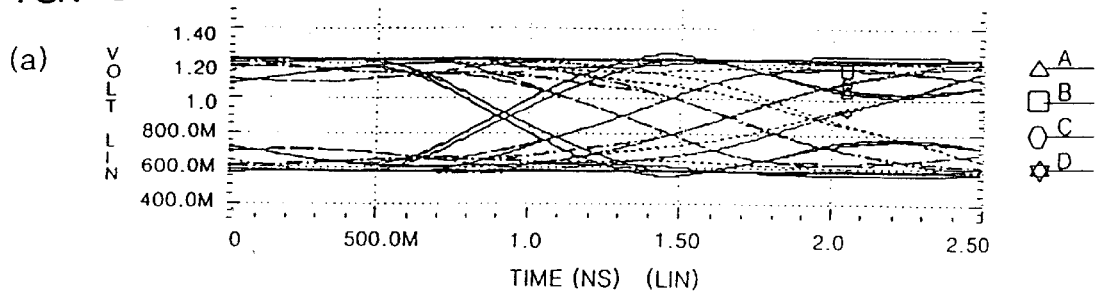
FIGS. 8(a), 8(b), 8(c), 8(d) are graphs showing a signal waveform inputted to a memory device in modules plugged into connectors of the present invention and the prior system board.
Figure 8:
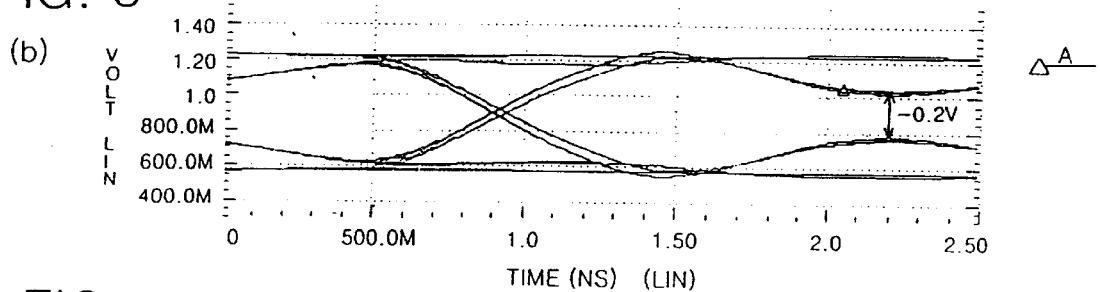
Figure 8:
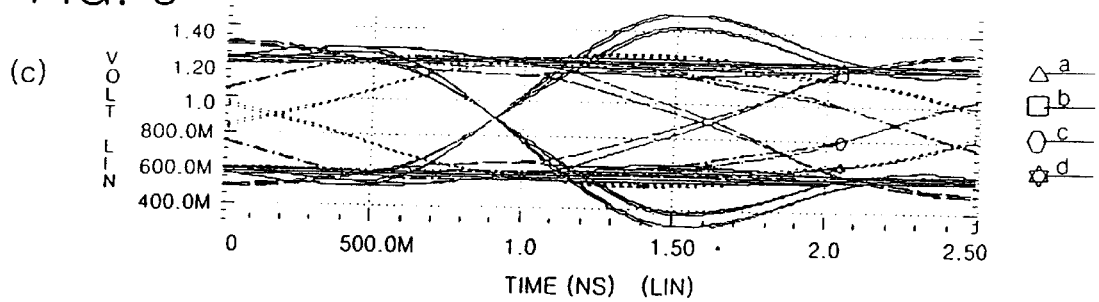
Figure 8:
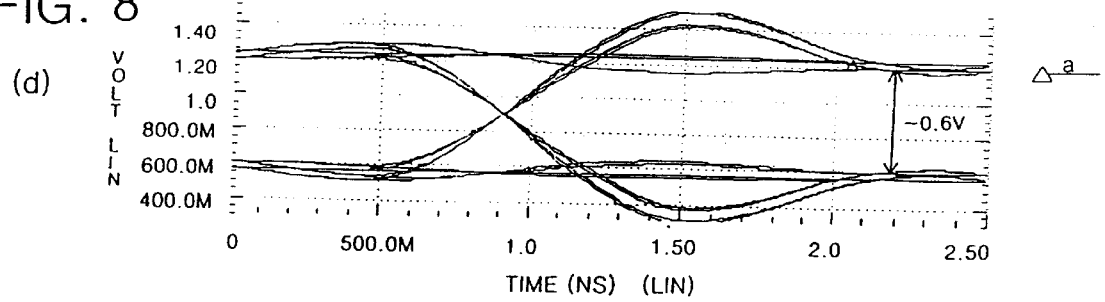

FIGS. 8(a) and (b) are graphs showing the signal waveform inputted to a memory device in modules plugged into connectors from the control apparatus of the prior art system board, and (c) and (d) are graphs showing the signal waveform inputted to a memory device in modules plugged into connectors from the control apparatus of a system board in accordance with the present invention.

FIGS. 8(a) and (c) each show signal waveforms A, B, C, D and a, b, c, d inputted into a memory device in modules plugged into each of a first, a third, a fifth and a seventh connector from a control apparatus, in case that modules are plugged into 8 connectors of a system board. FIGS. 8(b) and (d) show a signal waveform A and a inputted into a memory device in a module plugged into a first connector from a control apparatus.

By comparing FIGS. 8(a) and (c), it is seen that the signal waveform shown in FIG. 8(c) has less distortion than the signal waveform shown in FIG. 8(a). This is because the signal waveform shown in FIG. 8(c) has a wider width than the signal waveform shown in FIG. 8(a). Also, the distortion of a signal waveform A and a inputted into a memory device of a module plugged into a first connector from a control apparatus is most serious and is shown in FIGS. 8(b) and (d) separately. As can be seen from FIGS. 8(b) and (d), the signal waveform A shown in FIG. 8(b) has more severe distortion than the signal waveform a shown in FIG. 8(d). That is, the signal waveform shown in FIG. 8(b) shows a voltage difference of 0.2V, but the signal waveform shown in FIG. 8(d) shows a voltage difference of 0.6V.

An impedance control method of a system board of the present invention as stated above not only is applied between connectors of a mother board but also can be applied between memory devices in modules. That is, the impedance control method of the present invention can be applied between memory devices D1, . . . and Dk in modules M1, M2, M3, . . . and Mn of FIG. 5 and FIG. 6. Therefore, the system board and the impedance control method of said board of the present invention can reduce the signal distortion phenomenon by defining signal lines such that the characteristic impedance of signal lines between the control apparatus and modules (or devices) decreases exponentially in case that modules (or devices) are plugged on the board.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A system board, comprising:
    a plurality of modules; and
    a controller for controlling said plurality of modules,
    wherein signal lines are connected from said controller to said plurality of modules and are arranged so that the length of the signal lines between successive modules becomes shorter as a distance between each of said modules and the controller increases.

2. The system board according to claim 1, wherein a characteristic impedance of said signal lines between said controller and said plurality of modules decreases exponentially as a distance between each of said modules and the controller increases.

3. The system board according to claim 1, wherein each of said plurality of modules is a module comprising a plurality of memory devices.

4. The system board according to claim 1, wherein each of said plurality of modules is a memory device.

5. The system board according to claim 1, further comprising a dummy capacitor in said signal lines between said controller and said plurality of modules.

6. An impedance control method of a system board, comprising:
    providing a plurality of modules; and
    controlling said plurality of modules, such that signal lines are connected from said controller to said plurality of modules, and characteristic impedance of said signal lines between successive modules decreasing expontially as a distance between each of said modules and the controller increases.

7. A system board, comprising:

a plurality of modules; and a controller for controlling said plurality of modules, wherein signal lines are connected from said controller to said plurality of modules, and each of said signal lines between said controller and said plurality of modules comprises a dummy capacitor such that characteristic impedance of said signal lines between successive modules decreases exponentially as a distance between each of said modules and the controller increases.

8. The system board according to claim 7, wherein each of said plurality of modules is a module comprising a plurality of memory devices.

9. The system board according to claim 7, wherein each of said plurality of modules is a memory device.

10. The system board according to claim 7, wherein the magnitude of said dummy capacitor increases as the distance from said controller increases in a case in which the lengths of signal lines between said plurality of modules are equal.

* * * * *